United States Patent
Yoneda et al.

(10) Patent No.: US 6,529,415 B2
(45) Date of Patent: Mar. 4, 2003

(54) NONVOLATILE SEMICONDUCTOR MEMORY DEVICE ACHIEVING SHORTER ERASURE TIME

(75) Inventors: Takayuki Yoneda, Kawasaki (JP); Yasuhiko Tanuma, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/935,718

(22) Filed: Aug. 24, 2001

(65) Prior Publication Data

US 2002/0141243 A1 Oct. 3, 2002

(30) Foreign Application Priority Data

Mar. 30, 2001 (JP) ........................................ 2001-102173

(51) Int. Cl.$^7$ .............................................. G11C 16/04
(52) U.S. Cl. ................... 365/185.29; 365/218
(58) Field of Search ........................... 365/185.29, 201, 365/218

(56) References Cited

U.S. PATENT DOCUMENTS 5,138,580 A * 8/1992 Farrugia et al. ....... 365/185.09
5,675,546 A   10/1997 Leung ...................... 365/201
5,751,944 A * 5/1998 Roohparvar et al. ........ 365/201

FOREIGN PATENT DOCUMENTS

| EP | 0 681 295 A1 | 11/1995 |
| JP | 2000040400 | 2/2000 |

* cited by examiner

*Primary Examiner*—Michael S. Lebentritt
*Assistant Examiner*—VanThu Nguyen
(74) *Attorney, Agent, or Firm*—Arent Fox Kintner Plotkin & Kahn, PLLC

(57) ABSTRACT

A nonvolatile semiconductor memory device includes a memory cell array, a control circuit which repeatedly perform an automatic erasure operation with respect to an entirety of the memory cell array, the automatic erasure operation including a preparatory write operation prior to an erasure operation and a following erasure operation, and a counter which counts how many times the automatic erasure operation is performed with respect to the entirety of the memory cell array, wherein the control circuit stops the automatic erasure operation in response to an event that the counter counts a desired number.

9 Claims, 9 Drawing Sheets

FIG.5

| COMMAND SEQUENCE | | BUS WRITE CYCLE | 1ST BUS WRITE CYCLE | | 2ND BUS WRITE CYCLE | | 3RD BUS WRITE CYCLE | | 4TH BUS WRITE CYCLE | | 5TH BUS WRITE CYCLE | | 6TH BUS WRITE CYCLE | |
|---|---|---|---|---|---|---|---|---|---|---|---|---|---|---|
| | | | ADDRESS | DATA | ADDRESS | DATA | ADDRESS | DATA | ADDRESS | DATA | ADDRESS | DATA | ADDRESS | DATA |
| AUTOMATIC ERASURE CYCLING | WORD | 6 | 555H | AAH | 2AAH | 55H | 555H | 80H | 555H | AAH | 2AAH | 55H | 555H | CN |
| | BYTE | | AAAH | | 555H | | AAAH | | AAAH | ABH | 555H | | AAAH | |

NONVOLATILE SEMICONDUCTOR MEMORY DEVICE ACHIEVING SHORTER ERASURE TIME

BACKGROUND OF THE INVENTION

1. Field of the Invention

The present invention generally relates to nonvolatile semiconductor memory devices, and particularly relates to a nonvolatile rewritable semiconductor memory device.

2. Description of the Related Art

In nonvolatile semiconductor memory devices in which data can be erased and rewritten, a time length required for data erasure is relatively long in an initial state immediately after the shipping out from the factory. With repeated writing and erasing of data performed thereafter, the time length required for data erasure tends to settle at a relatively short time length.

FIG. 1 is a drawing showing the relationship between the number of cycles of data writing and erasure and the time length required for data erasure.

In FIG. 1, the horizontal axis shows the number of cycles of data writing and erasure, and the vertical axis shows the time length required for erasing one sector. Data is obtained with respect to product samples. Since there is a product variation in terms of characteristics thereof, a plurality of characteristic curves are plotted in the figure. As shown in FIG. 1, erasure of one sector takes approximately 1.5 seconds in an initial state, whereas erasure of one sector takes only 0.3 to 0.4 second after repeating the cycles of data writing and erasure approximately 100 times. Thereafter, the erasure time stays relatively short regardless of the number of cycles of subsequent data writing and erasure.

Because of the characteristics of the nonvolatile semiconductor memory devices as described above, the manufacturers need to guarantee their products by specifying the longest erasure time in the initial state. When the erasure time becomes shorter after the use of products, therefore, the guaranteed erasure time ends up being excessively long compared to the actual erasure time.

In order to make the erasure time settle at a relatively short length at a user end, the user has to manually repeat automatic erasure operations many times in order to repeat rewriting of data where the automatic erasure operation is defined as an operation that performs preparatory data writing prior to an erasure operation and then performs the erasure operation. This is a troublesome task in a practical sense. The manufacturers, on the hand, can repeat automatic erasure operations many times by use of a device tester, a handler, or the like. This will result in a significant drop in production efficiency because of the time and labor required for such a task.

Accordingly, there is a need for a nonvolatile semiconductor memory device that can set an erasure time to a relatively short stable time length.

SUMMARY OF THE INVENTION

It is a general object of the present invention to provide a nonvolatile semiconductor memory device that substantially obviates one or more of the problems caused by the limitations and disadvantages of the related art.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by a nonvolatile semiconductor memory device particularly pointed out in the specification in such full, clear, concise, and exact terms as to enable a person having ordinary skill in the art to practice the invention.

To achieve these and other advantages and in accordance with the purpose of the invention, as embodied and broadly described herein, the invention provides a nonvolatile semiconductor memory device, including a memory cell array, a control circuit which repeatedly perform an automatic erasure operation with respect to an entirety of the memory cell array, the automatic erasure operation including a preparatory write operation prior to an erasure operation and a following erasure operation, and a counter which counts how many times the automatic erasure operation is performed with respect to the entirety of the memory cell array, wherein the control circuit stops the automatic erasure operation in response to an event that the counter counts a desired number.

The nonvolatile semiconductor memory device as described above is provided with a function to automatically perform automatic erasure cycles as many times as desired to repeatedly carry out the preparatory write operation prior to an erasure operation and the following erasure operation. This function may be activated in response to a command input from an exterior of the device. This allows users or manufacturers to make the nonvolatile semiconductor memory device automatically perform the automatic erasure operations as many times as desired. Through this operation, the nonvolatile semiconductor memory device can be settled in a condition that exhibits a relatively short and stable erasure time compared to an initial erasure time.

Further, a method of erasing a nonvolatile semiconductor memory device according to the present invention includes the steps of starting a predetermined operation in response to a predetermine signal input from an exterior of said device and continuing the predetermined operation, said predetermined operation repeatedly performing an automatic erasure operation with respect to an entirety of a memory cell array, counting a number as to how many times the automatic erasure operation is performed, and stopping the predetermined operation in response to an event that the counted number reaches a predetermined number.

BRIEF DESCRIPTION OF THE DRAWINGS

FIG. 5 is a drawing showing an example of a command input according to the present invention;

DESCRIPTION OF THE PREFERRED EMBODIMENTS

In the following, embodiments of the present invention will be described with reference to the accompanying drawings.

Figure 2:
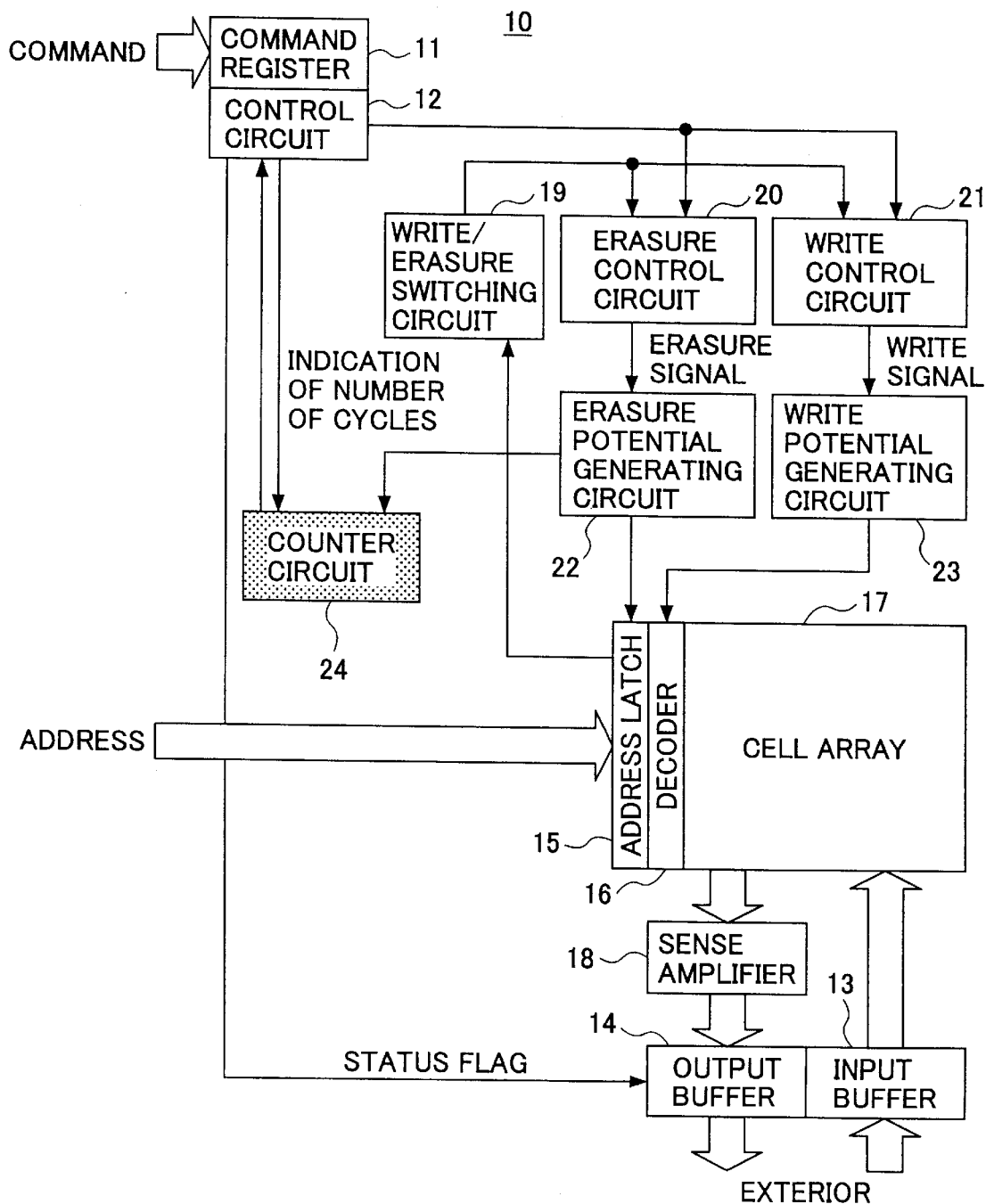
FIG. 2 is a block diagram of a nonvolatile semiconductor memory device according to the present invention.

FIG. 2 is a block diagram of a nonvolatile semiconductor memory device according to the present invention.

A nonvolatile semiconductor memory device 10 of FIG. 2 includes a command register 11, a control circuit 12, an input buffer 13, an output buffer 14, an address latch 15, a decoder 16, a cell array 17, a sense amplifier 18, a write/erasure switching circuit 19, an erasure control circuit 20, a write control circuit 21, an erasure potential generating circuit 22, a write potential generating circuit 23, and a counter circuit 24.

The command register 11 receives and stores a command therein as the command is supplied from an exterior of the device, followed by supplying the command to the control circuit 12. The control circuit 12 operates as a state machine in accordance with the command, and controls various units of the nonvolatile semiconductor memory device 10.

The address latch 15 receives address signals provided from the exterior, and latches them, followed by supplying them to the decoder 16. The decoder 16 decodes an address supplied from the address latch 15, and activates a word line in the cell array 17 according to the decoding results. Further, the decoder 16 selects bit lines in the cell array 17 and connects them to the sense amplifier 18 according to the decoding results. In this manner, data read/write paths are established with respect to the cell array 17.

The cell array 17 includes a memory cell array, word lines, bit lines, and the like, and stores information in the memory cells. At the time of a data read operation, for example, data of memory cells selected by an activated word line are read out to the bit lines, and data of selected bit lines are then supplied to the sense amplifier 18. At the time of a data erasure or writing operation, the erasure potential generating circuit 22 or the write potential generating circuit 23 generates a potential under the control of the control circuit 12, and the word lines and bit lines of the cell array 17 are set to respective potentials appropriate for the desired operation. This achieves ejection or injection of electric charge with respect to the memory cells.

The sense amplifier 18 compares the level of data supplied from the cell array 17 with a reference level for data reading, and checks whether the data is zero or one. Results of the check are supplied as the read data to the exterior of the device from the output buffer 14. Further, verify operations that are performed with the data write or erasure operations are conducted by comparing the level of data supplied from the cell array 17 with a reference level for data writing or erasure.

At the time of a data write operation, the input buffer 13 receives data from the exterior of the device, and supplies the data to the cell array 17.

The erasure control circuit 20 supplies an erasure signal to the erasure potential generating circuit 22 in response to an instruction from the control circuit 12, and controls an overall erasure operation. The write control circuit 21 supplies a write signal to the write potential generating circuit 23 in response to an instruction from the control circuit 12, and controls an overall write operation. The erasure potential generating circuit 22 generates the erasure potential that is necessary for erasure operation in response to the erasure signal, and supplies the erasure potential to the decoder 16.

Further, the erasure potential generating circuit 22 supplies a signal indicative of performing of an erasure operation to the counter circuit 24. The write potential generating circuit 23 generates a write signal that is necessary for data write operations in response to the write signal.

In the present invention, a predetermined command is entered from the exterior of the device, for example, so that the automatic erasure operations are repeated mechanically as many times as desired.

When a command indicative of an automatic erasure operation is entered as a combination of a predetermined control signal, an address, and data, for example, from the exterior of the device, an automatic erasure cycling function is initiated to repeatedly perform the automatic erasure operation. The command input from the exterior of the device may specify an initial value that corresponds to the number of cycles, and this initial value may be stored in the counter circuit 24. The counter circuit 24 then counts the automatic erasure operations actually performed, thereby making it possible to repeat the automatic erasure operations a specified number of times.

When the automatic erasure cycling function is activated, a writing operation prior to an erasure operation is carried out first under the control of the write control circuit 21. In response to the write signal supplied from the control circuit 12, the write potential generating circuit 23 generates a write potential, and the decoder 16 uses this write potential to perform write operations (program operations) on all bits in the cell array 17. When all the bits of the cell array 17 are written, a signal indicating that the current address has reached a maximum address is supplied from the address latch 15 to the write/erasure switching circuit 19. In response to this signal, the write/erasure switching circuit 19 supplies a signal indicative of a switching request to the erasure control circuit 20 and the write control circuit 21, resulting in an operation being switched from the preparatory writing operation prior to an erasure operation to the actual erasure operation. The erasure control circuit 20 controls the erasure operation in accordance with the switch signal.

The erasure control circuit 20 supplies an erasure signal to the erasure potential generating circuit 22. In response, the erasure potential generating circuit 22 generates an erasure potential. The decoder 16 uses this erasure potential to perform erasure operations on all the bits in the cell array 17. The erasure potential generating circuit 22 further supplies a signal indicative of performing of the erasure operation to the counter circuit 24.

In response, the counter circuit 24 increments an internal count by one. It should be noted that the signal requesting counting up may be a signal from the write/erasure switching circuit 19 or the erasure signal form the erasure control circuit 20, and the particular configuration described here is not intended as a limiting example. The control circuit 12 continues to request the automatic erasure cycling function until the count of the counter circuit 24 reaches a predetermined number.

Accordingly, during a period when the automatic erasure operation has not yet been performed a specified cycle times, the signal indicating that the current address has reached a maximum address is supplied from the address latch 15 to the write/erasure switching circuit 19 upon the erasure of all bits in the cell array 17. In response to this signal, the write/erasure switching circuit 19 supplies the signal indicative of a switching request to the erasure control circuit 20 and the write control circuit 21, thereby switching from the erasure operation to a preparatory writing operation performed prior to an erasure operation.

Thereafter, the preparatory write operation prior to an erasure operation and the following erasure operation are repeatedly performed in turn. That is, the automatic erasure operations are repeatedly performed.

After automatic erasure operations are performed a specified number of cycling times, which results in the count of the counter circuit 24 reaching a predetermined count, a signal indicative of this fact is supplied from the counter circuit 24 to the control circuit 12. In response, the control circuit 12 stops the automatic erasure cycling operation. It should be noted that a series of operations from the start of automatic erasure cycling operation responding to the command input to the end of the automatic erasure cycling operation responding to the counting of the predetermined number is mechanically (i.e., automatically) performed within the nonvolatile semiconductor memory device 10.

As described above, the nonvolatile semiconductor memory device of the present invention is provided with a function to automatically perform automatic erasure cycles as many times as desired to repeatedly carry out a preparatory write operation prior to an erasure;operation and the following erasure operation, and allows a command input to initiate this function. This allows users or manufacturers to make the nonvolatile semiconductor memory device automatically perform the automatic erasure operations as many times as desired. Through this operation, the nonvolatile semiconductor memory device can be settled in a condition that exhibits a relatively short and stable erasure time compared to an initial erasure time.

Figure 1:
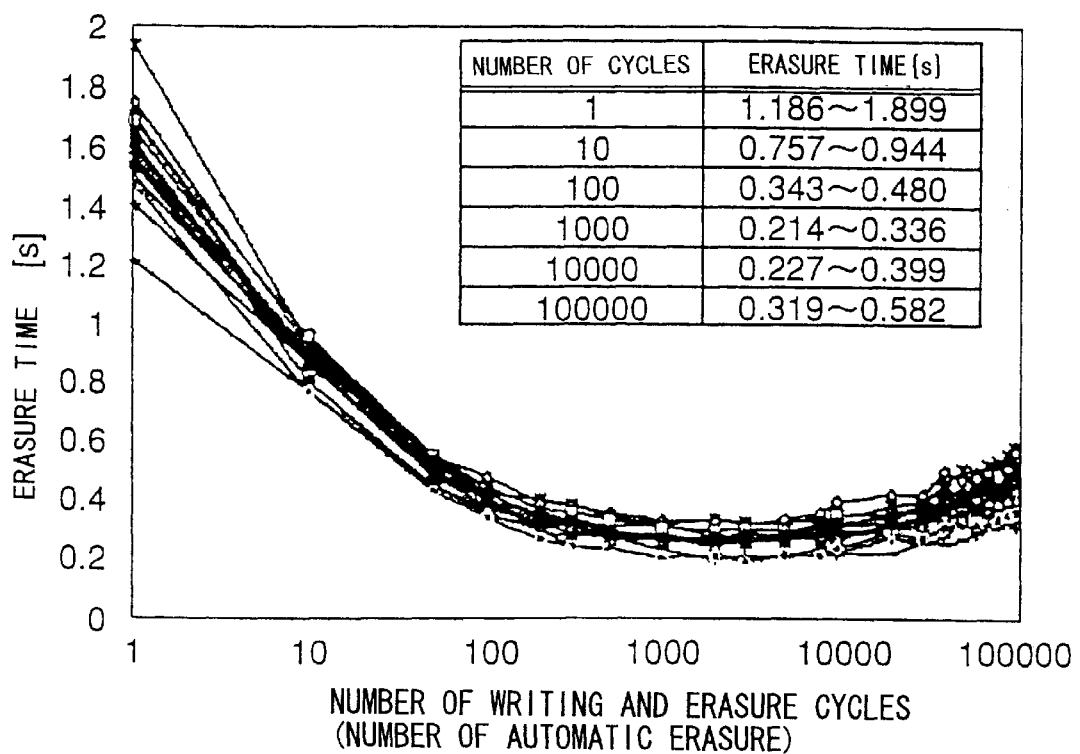
FIG. 1 is a drawing showing the relationship between the number of cycles of data writing and erasure and the time length required for data erasure.

Namely, while erasure of one sector takes about 1.5 seconds in an initial state as shown in FIG. 1, erasure of one sector takes only 0.3 to 0.4 second after repeating cycles of data writing and erasure approximately 100 times. Thereafter, the erasure time stays relatively short regardless of the number of cycles of subsequent data writing and erasure. Accordingly, the present invention can set the nonvolatile semiconductor memory device in a condition that shows a relatively short and stable erasure time such as 0.3 to 0.4 second by performing an automatic erasure cycling that repeats automatic erasure operations 100 times, for example.

Figure 3:
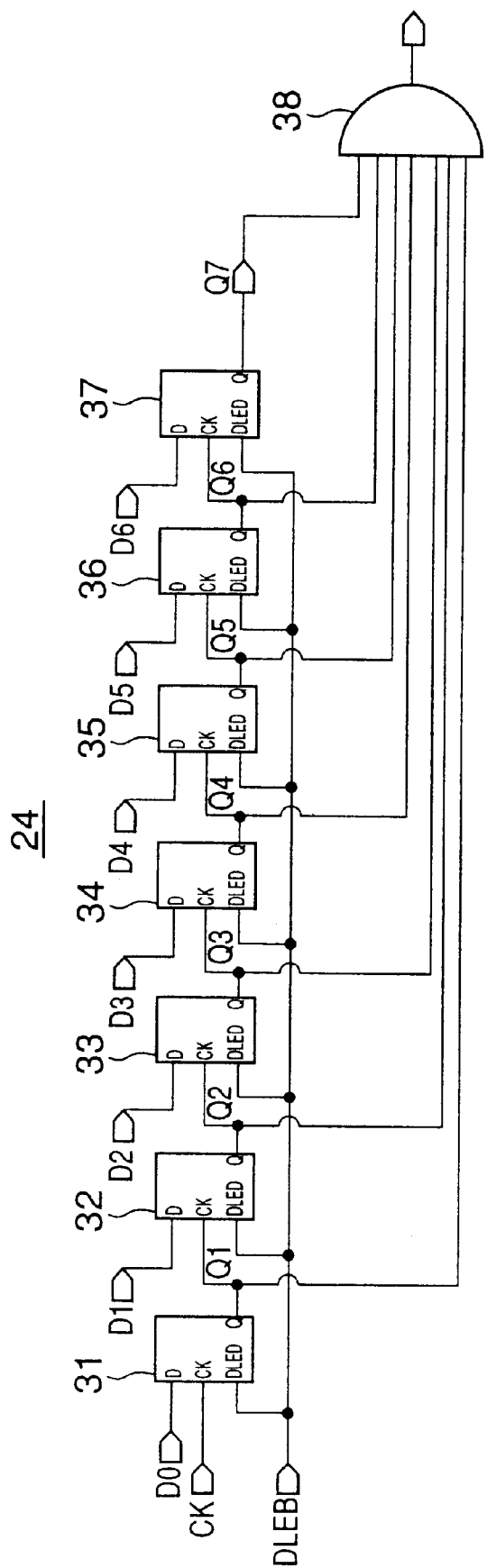
FIG. 3 is a circuit diagram showing an example of a circuit diagram of a counter circuit shown in FIG. 2.

FIG. 3 is a circuit diagram showing an example of a circuit diagram of the counter circuit 24.

The counter circuit 24 of FIG. 3 includes seven flip-flops 31 through 37 and an AND circuit 38, and serves as a 7-bit counter. In this example, therefore, the number of cycles can be counted up to 128. The flip-flops 31 through 37 are toggle flip-flops, each of which has data stored therein changing from 0 to 1 and from 1 to 0 each time a pulse is input to the CK input terminal. The data stored therein is output from the Q output terminal, and is supplied to the CK input terminal of the flip-flop situated at the next following stage.

When a desired number of times is specified by the command input from the exterior of the device, the control circuit 12 stores an initial value corresponding to the desired count in the counter circuit 24. If the desired count is 100, for example, the control circuit 12 sets a data-load-enable signal DLEB to HIGH, and sets "27" as an initial value to the flip-flops 31 through 37 via the D input terminals. The CK input terminal of the flip-flop 31 receives the pulse signal indicative of performing of an erasure operation as it is supplied from the erasure potential generating circuit 22, for example. As the erasure operations are carried out 100 times, the count of the counter circuit 24 becomes 127, so that the outputs of the flip-flops 31 through 37 are all HIGH. In response, the AND circuit 38 supplies a HIGH output, which is supplied to the control circuit 12. By this, the control circuit 12 ascertains that the automatic erasure operations have been performed the desired number of times.

In the configuration of the counter circuit 24 as described above, an initial value corresponding to a desired number of cycles is set in the counter circuit 24. Instead of this configuration, the counter circuit 24 may be provided with a counter, a register, and a comparator, and a desired number of cycles as such may be set in the register, with the counter starting the count thereof invariably from zero. In this case, the fact that cycles have been performed the desired number of times can be reported to the control circuit 12 when the comparator indicates a match by comparing the count of the counter with the value of the register.

The description of the counter circuit 24 provided above is merely directed to an example of a possible configuration. The counter circuit of the present invention serves its intended purpose as long as a function is provided to count the number of automatic erasure operations performed and to detect an event that the automatic erasure operations have been performed a specified number of times. The counter circuit of the present invention is not limited to a particular circuit configuration.

Figure 4:
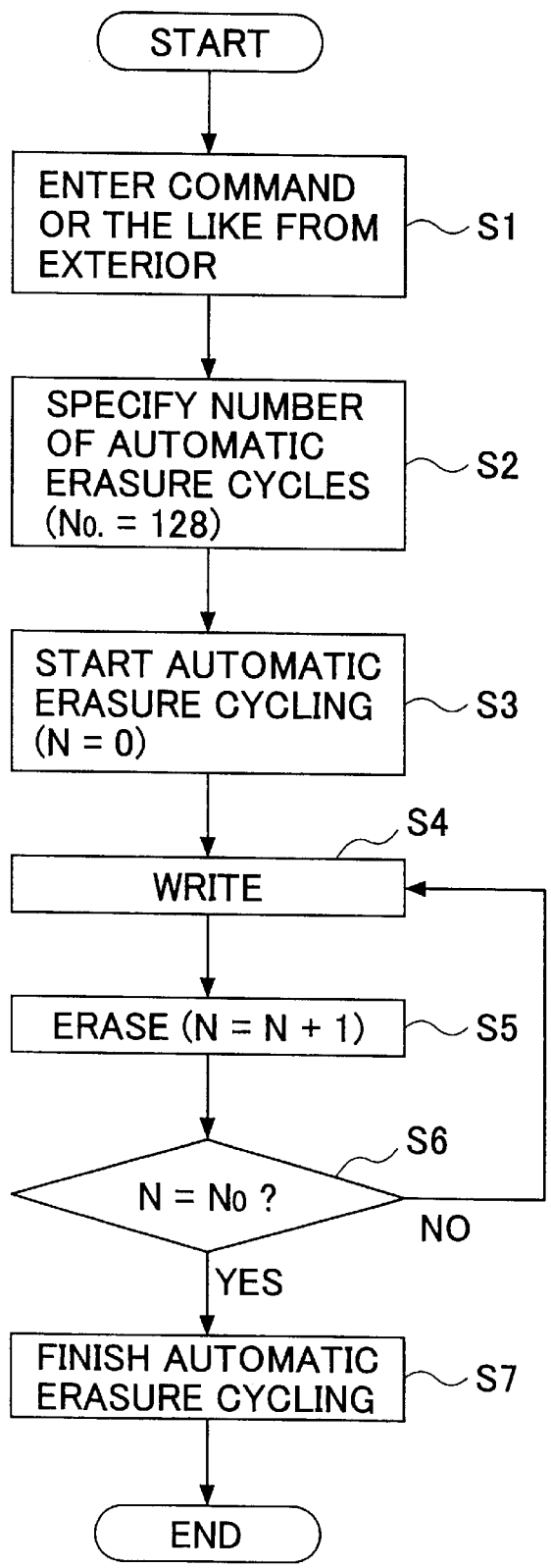
FIG. 4 is a flowchart of an automatic erasure cycling operation according to the present invention.

FIG. 4 is a flowchart of an automatic erasure cycling operation according to the present invention.

At step S1, a command or the like is entered from the exterior of the device to request an automatic erasure cycling operation. This command may be input as a command sequence by specifying a combination of a control signal, an address, and data over a plurality of input cycles, as will be described later.

At step S2, the number of automatic erasure operations is specified. The number of automatic erasure operations may be 128. This number may be provided as part of the command input sequence as will be described later.

At step S3, an automatic erasure cycling is started.

At step S4, a preparatory data writing operation prior to an erasure operation is performed with respect to all the bits of the cell array 17.

At step S5, an erasure operation is performed with respect to all the bits of the cell array 17, and the count N of automatic erasure cycles is incremented by one.

At step S6, a check is made as to whether the count N indicates that automatic erasure operations have been performed as many times as specified by the desired number (e.g., 128). If the automatic erasure operations have not been performed the desired number of times, the procedure goes back to the step S4, and the steps S4 through S6 will be repeated. If the automatic erasure operations have been performed the desired number of times, the procedure goes to step S7.

At the step S7, the automatic erasure cycling operation comes to an end.

In the manner as described above, the nonvolatile semiconductor memory device of the present invention is provided with a function to automatically perform automatic erasure cycles as many times as desired to repeatedly carry out a preparatory write operation prior to an erasure operation and the following erasure operation, and allows a command input to initiate this function. This allows users or manufacturers to make the nonvolatile semiconductor memory device automatically perform the automatic erasure operations as many times as desired. Through this operation, the nonvolatile semiconductor memory device can be settled in a condition that exhibits a relatively short and stable erasure time compared to an initial erasure time.

To this end, the counter counts the number of automatic erasure operations actually performed, and the automatic erasure operation is brought to an end when the desired count is reached. This achieves the automatic erasure cycling function by use of a simple circuit structure.

FIG. 5 is a drawing showing an example of a command input according to the present invention.

Related-art nonvolatile semiconductor memory devices are provided with a function to allow a command to be entered as a sequence where the command is specified as a combination of a control signal, an address, and a data input over multiple input cycles. For example, when a chip erasure mode that erases the entirety of the chip needs to be performed, a predetermined combination of a control signal, an address, and an data input is input over six cycles, thereby entering into the desired operation mode. FIG. 5 shows a command sequence that requests the automatic erasure cycling operation.

The word and byte shown in the command sequence field relate to the case of using the nonvolatile semiconductor memory device 10 as having an 8-bit input/output and the case of using the nonvolatile semiconductor memory device 10 as having a 16-bit input/output, respectively. Data CN input at the 6th bus write cycle indicates the desired number of cycles that are performed during the automatic erasure cycling operation.

Figure 6:
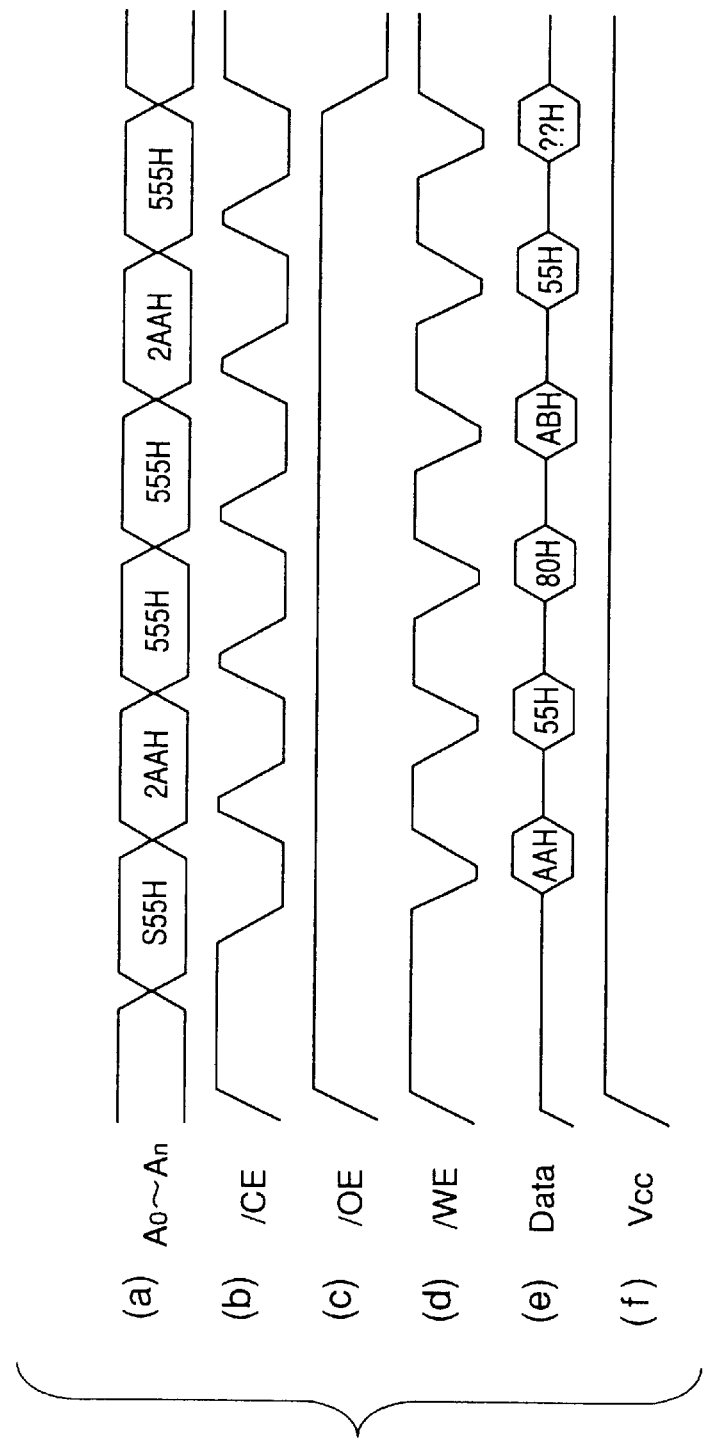
FIG. 6 is a timing chart showing a command sequence that specifies the automatic erasure cycling operation.

FIG. 6 is a timing chart showing the command sequence that specifies the automatic erasure cycling operation. FIG. 6 shows the command sequence input in a case in which the nonvolatile semiconductor memory device 10 is used as having an 8-bit input/output.

A letter designation (a) of FIG. 6 shows an address input, which is 555H at the first cycle, 2AAH at the second cycle, 555H at the third cycle, 555H at the forth cycle, 2AAH at the fifth cycle, and 555H at the sixth cycle, as defined in FIG. 5. Letter designation (b) through (d) of FIG. 6 show a chip enable signal /CE, an output enable signal /OE, and a write enable signal /WE, respectively, which are control signals. A letter designation (e) of FIG. 6 shows a data input, which is AAH at the first cycle, 55H at the second cycle, 80H at the third cycle, ABH at the forth cycle, 55H at the fifth cycle, and the desired number of cycles at the sixth cycle, as defined in FIG. 5.

As was described in connection with FIG. 5 and FIG. 6, the command sequence function that is provided in related-art nonvolatile semiconductor memory devices can be utilized so as to define a command sequence for an automatic erasure cycling operation. This makes it possible to activate the automatic erasure cycling function of the present invention by entering a command sequence. In detail, the command sequence each part of which is entered successively is stored in the command register 11 of FIG. 2, and, based on this stored command, the control circuit 12 controls the overall operation of the nonvolatile semiconductor memory device 10, thereby performing the automatic erasure cycling operation described in connection with FIG. 2 through FIG. 4.

Figure 7:
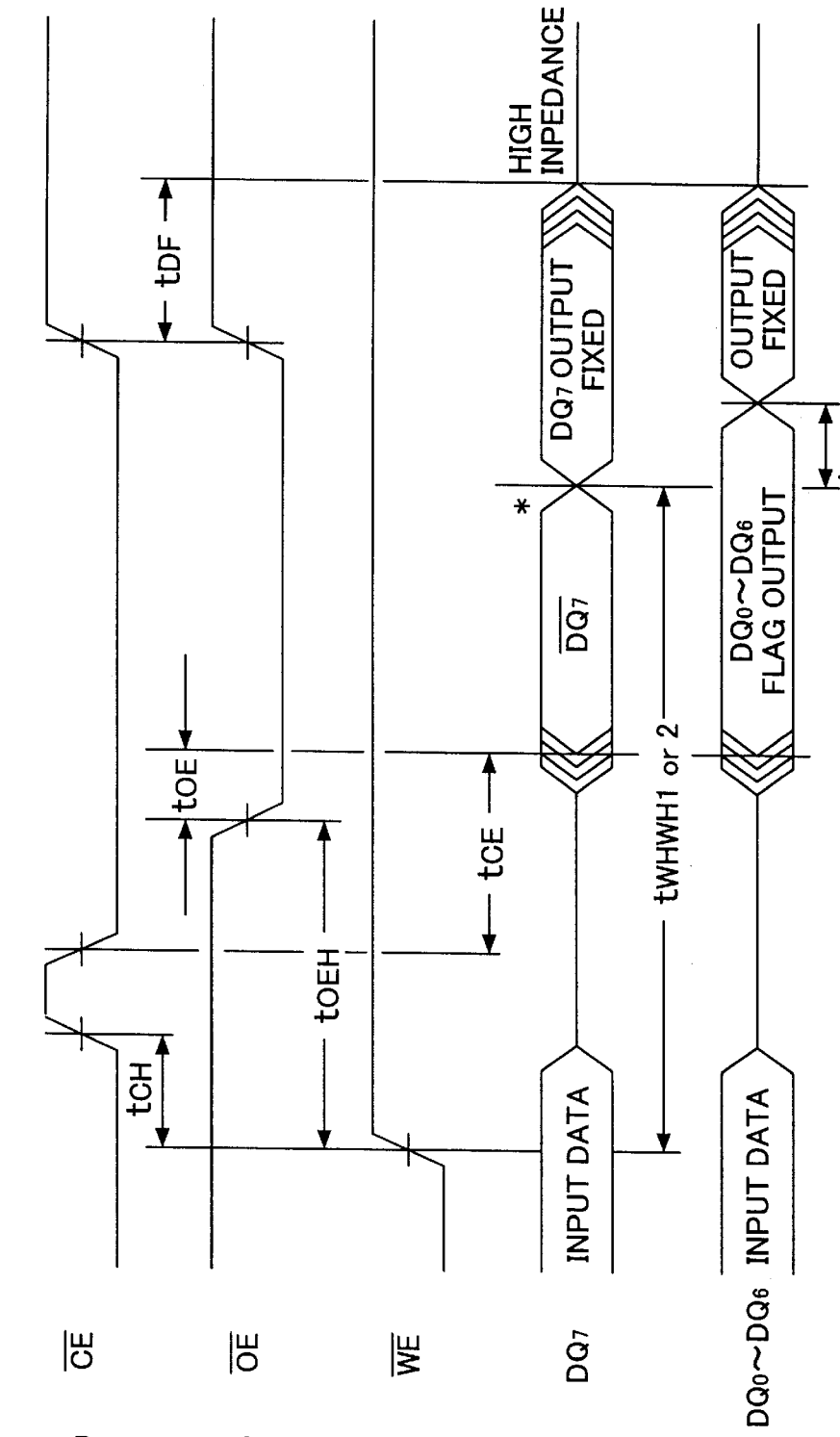
FIG. 7 is a timing chart showing data polling timing of a nonvolatile semiconductor memory device.

FIG. 7 is a timing chart showing data polling timing of the nonvolatile semiconductor memory device.

In related-art nonvolatile semiconductor memory devices, a predetermined flag is checked through data polling with an aim of ascertaining whether the automatic erasure operation is completed. FIG. 7 shows the timing of such a data polling operation.

In FIG. 7, a letter designation (a) shows a chip enable signal /CE, and a letter designation (b) illustrates an output enable signal /OE, with a letter designation (c) indicating a write enable signal /WE. At the timing indicated in (a) through (c) of FIG. 7, the control signals are input to the nonvolatile semiconductor memory device, so that a status flag indicative of a device status is output from a data-output terminal. A letter designation (d) illustrates an output of a data-output terminal $DQ_7$, and a letter designation (e) shows outputs of data-output terminals $DQ_0$ through $DQ_6$. The output of the data-output terminal $DQ_7$ shown as (d) is a status flag that indicates whether the nonvolatile semiconductor memory device is in the process of performing an erasure operation.

The output of the data-output terminal $DQ_7$ is kept at a LOW level during the automatic erasure operation, and is changed to HIGH after the completion of the automatic erasure operation. If the control signals shown as (a) through (c) in FIG. 7 are input, and the output of the data-output terminal $DQ_7$ is monitored, then, it is possible to check from the exterior of the device whether the erasure operation is completed in the nonvolatile semiconductor memory device.

In the automatic erasure cycling operation of the present invention, a conventional automatic erasure operation is repeatedly and consecutively performed. Accordingly, if the status flag of the nonvolatile semiconductor memory device as shown in FIG. 7 is monitored in the same manner as in the related-art configuration, it is easy to ascertain from the exterior of the device whether the automatic erasure cycling operation is completed.

Figure 8:
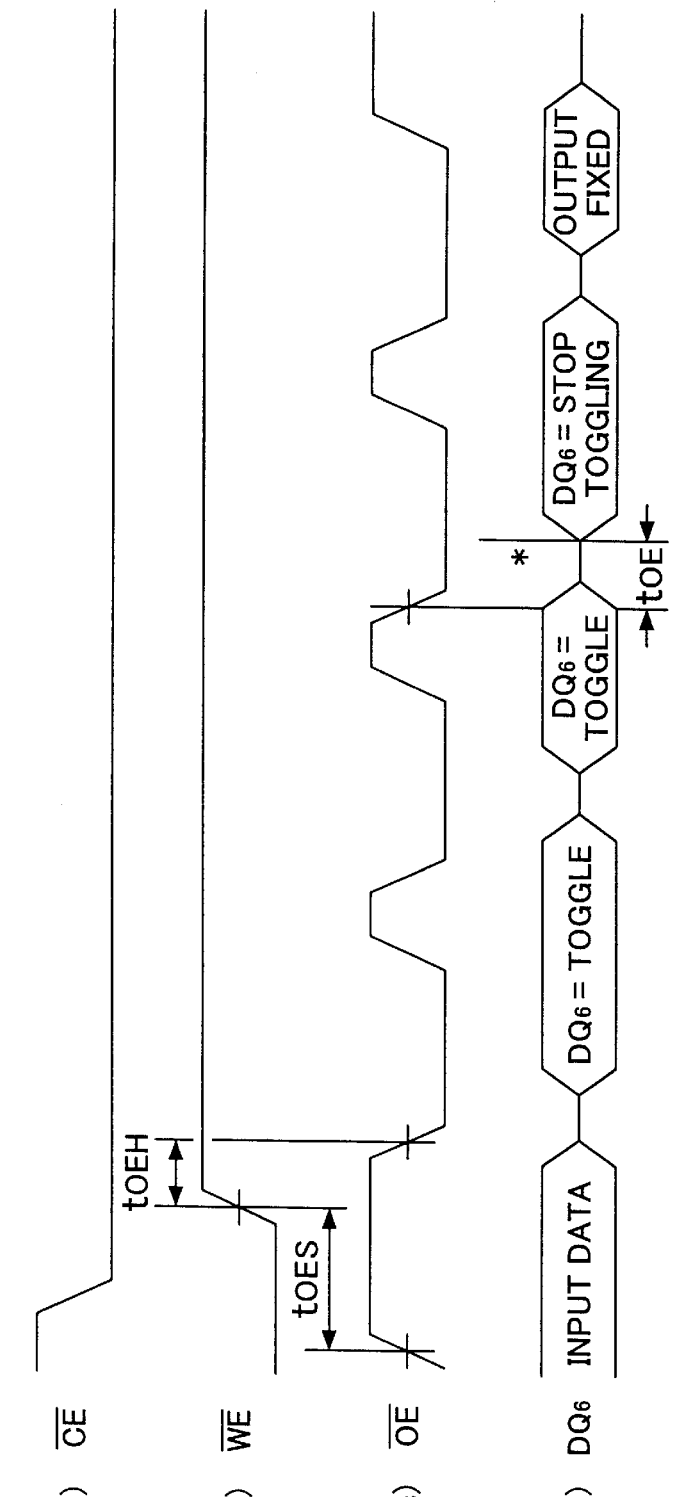
FIG. 8 is a timing chart showing a toggle bit timing of a nonvolatile semiconductor memory device.

FIG. 8 is a timing chart showing a toggle bit timing of a nonvolatile semiconductor memory device.

In related-art nonvolatile semiconductor memory devices, a toggle bit, provided in addition to the data polling function, can be used to detect the device status so as to ascertain whether the automatic erasure operation is completed. FIG. 8 shows the timing of such a toggle bit.

In FIG. 8, a letter designation (a) shows a chip enable signal /CE, and a letter designation (b) illustrates a write enable signal /WE, with a letter designation (c) indicating an output enable signal /OE. At the timing indicated in (a) through (c) of FIG. 7, the control signals are input to the nonvolatile semiconductor memory device, and an output of a data-output terminal $DQ_6$ shown as a letter designation (d) in FIG. 8 is monitored, thereby ascertaining from outside whether the nonvolatile semiconductor memory device is in the process of performing an erasure operation.

In detail, the output enable signal /OE is asserted as intermittent pulses as shown as (c) in FIG. 8, resulting in intermittent outputs being asserted from the data output terminal $DQ_6$. During the automatic erasure operation, the data output terminal $DQ_6$ exhibits a toggle operation by alternating between HIGH and LOW. After the end of the automatic erasure operation, the data output terminal $DQ_6$ does not show a toggle operation any longer. By checking the output of the data output terminal $DQ_6$ to see if it toggles, it is possible to ascertain from outside whether the erasure operation is completed in the nonvolatile semiconductor memory device.

In the automatic erasure cycling operation of the present invention, a conventional automatic erasure operation is repeatedly and consecutively performed. Accordingly, if the toggle bit indicative of the status of the nonvolatile semiconductor memory device as shown in FIG. 8 is monitored in the same manner as in the related-art configuration, it is easy to ascertain from the exterior of the device whether the automatic erasure cycling operation is completed.

Figure 9:
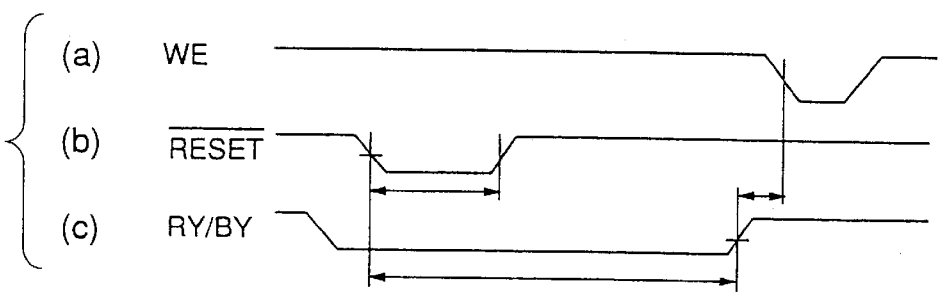
FIG. 9 is a timing chart showing the timing of a hardware reset of a nonvolatile semiconductor memory device.

FIG. 9 is a timing chart showing the timing of a hardware reset of a nonvolatile semiconductor memory device.

In related-art nonvolatile semiconductor memory devices, a hardware reset function is provided as a precaution against a hung up state of the device caused by a malfunction occurring during the automatic erasure operation. In FIG. 9, a letter designation (a) shows a write enable signal, and a letter designation (b) shows a reset signal /RESET, with a letter designation (c) illustrating a ready busy signal output RY/BY. The control signals shown as (a) and (b) in FIG. 9 are input so as to trigger a compulsory hardware reset in the nonvolatile semiconductor memory device that has been in a hung up state.

In the automatic erasure cycling operation of the present invention, a conventional automatic erasure operation is repeatedly and consecutively performed. Accordingly, if the hardware reset is performed as shown in FIG. 9 in the same manner as in the related-art configuration, it is easy to finish the automatic erasure cycling operation compulsorily and to cause compulsory resetting to the nonvolatile semiconductor memory device that has fallen into a hung up state during the automatic erasure cycling.

Further, the present invention is not limited to these embodiments, but various variations and modifications may be made without departing from the scope of the present invention.

The present application is based on Japanese priority application No. 2001-102173 filed on Mar. 30, 2001, with the Japanese Patent Office, the entire contents of which are hereby incorporated by reference.

What is claimed is:

1. A nonvolatile semiconductor memory device, comprising:
    a memory cell array;
    a control circuit which repeatedly perform an automatic erasure operation with respect to an entirety of said memory cell array, said automatic erasure operation including a preparatory write operation prior to an erasure operation and a following erasure operation; and
    a counter which counts how many times the automatic erasure operation is performed with respect to the entirety of said memory cell array,
    wherein said control circuit stops the automatic erasure operation in response to an event that said counter counts a desired number.

2. The nonvolatile semiconductor memory device as claimed in claim 1, wherein said control circuit starts the automatic erasure operation in response to a signal input from an exterior of said nonvolatile semiconductor memory device.

3. The nonvolatile semiconductor memory device as claimed in claim 2, wherein said signal input is a command sequence input.

4. The nonvolatile semiconductor memory device as claimed in claim 1, wherein the desired number is determined by a signal input from an exterior of said nonvolatile semiconductor memory device.

5. The nonvolatile semiconductor memory device as claimed in claim 1, wherein a signal indicative of whether the automatic erasure operation is being performed is supplied to an exterior of said nonvolatile semiconductor memory device in response to a predetermined control signal input from the exterior.

6. The nonvolatile semiconductor memory device as claimed in claim 5, wherein the signal indicative of whether the automatic erasure operation is being performed is a status flag.

7. The nonvolatile semiconductor memory device as claimed in claim 1, wherein the automatic erasure operation is terminated in response to a predetermined control signal input from an exterior of said nonvolatile semiconductor memory device.

8. The nonvolatile semiconductor memory device as claimed in claim 1, further comprising:
    an address latch which indicate an address at which the preparatory write operation prior to an erasure operation and the following erasure operation are performed; and
    a switch circuit which switches between the preparatory write operation prior to an erasure operation and the following erasure operation in response to an event that the address indicated by said address latch reaches a maximum address.

9. A method of erasing a nonvolatile semiconductor memory device, comprising the steps of:
    starting a predetermined operation in response to a predetermined signal input from an exterior of said device and continuing the predetermined operation, said predetermined operation repeatedly performing an automatic erasure operation with respect to an entirety of a memory cell array;
    counting a number as to how many times the automatic erasure operation is performed; and
    stopping the predetermined operation in response to an event that the counted number reaches a predetermined number.

* * * * *